United States Patent
Choi et al.

(10) Patent No.: US 8,183,089 B2
(45) Date of Patent: May 22, 2012

(54) METHOD FOR MANUFACTURING PACKAGE SYSTEM INCORPORATING FLIP-CHIP ASSEMBLY

(75) Inventors: A Leam Choi, Ichon-si (KR); Young Jin Woo, Ichon-si (KR); Junwoo Myung, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/976,753

(22) Filed: Dec. 22, 2010

(65) Prior Publication Data

US 2011/0092021 A1    Apr. 21, 2011

Related U.S. Application Data

(62) Division of application No. 12/122,631, filed on May 16, 2008, now Pat. No. 7,859,120.

(51) Int. Cl.
*H01L 21/44* (2006.01)

(52) U.S. Cl. .................. 438/108; 257/E21.511

(58) Field of Classification Search .................. 438/51, 438/108, 112; 257/E21.503, E21.511
See application file for complete search history.

(56) References Cited

U.S. PATENT DOCUMENTS

| | | |
|---|---|---|
| 5,334,857 A | 8/1994 | Mennitt et al. |
| 6,815,829 B2 | 11/2004 | Shibata |
| 6,825,567 B1 | 11/2004 | Wang et al. |
| 6,921,968 B2 | 7/2005 | Chung |
| 7,045,887 B2 | 5/2006 | Karnezos |
| 7,061,088 B2 | 6/2006 | Karnezos |
| 7,196,416 B2 | 3/2007 | Hochstenbach et al. |
| 7,573,136 B2 * | 8/2009 | Jiang et al. ............ 257/777 |

* cited by examiner

*Primary Examiner* — Quoc Hoang
(74) *Attorney, Agent, or Firm* — Ishimaru & Associates LLP; Mikio Ishimaru; Stanley Chang (57) ABSTRACT

A method for manufacturing a package system includes: providing a first semiconductor die; mounting a second semiconductor die on the first semiconductor die using an inter-die interconnect to form a flip-chip assembly; and attaching the flip-chip assembly on a package substrate with a contact pad, a test connection, a z-bond pad, and a die receptacle, with the first semiconductor die in the flip-chip assembly fitting inside the die receptacle.

10 Claims, 5 Drawing Sheets

METHOD FOR MANUFACTURING PACKAGE SYSTEM INCORPORATING FLIP-CHIP ASSEMBLY

CROSS-REFERENCE TO RELATED APPLICATION(S)

This is a divisional of U.S. patent application Ser. No. 12/122,631 filed May 16, 2008 now U.S. Pat. No. 7,859,120.

TECHNICAL FIELD

The present invention relates generally to semiconductor packaging technology, and more particularly to multi-chip package systems.

BACKGROUND ART

System requirements for consumer electronics have motivated in the implementation of integrated circuit packages incorporating several semiconductor dies or "chips". Such multi-chip packages may be realized by connecting multiple semiconductor dies on a single package substrate incorporating interconnects.

Alternatively, the Package-in-Package (PiP) approach for packaging multi-chip modules involves first mounting a semiconductor die on a package substrate with interconnects, forming an Internal Stacking Module (ISM). This package module can be tested individually prior to assembly into a multi-chip package. Thus the PiP approach provides a means of pre-testing package sub-assemblies (i.e., internal stacking modules), enabling the assembly of complex multi-chip packages using "known good packages." This modular approach for assembling multi-chip packages reduces overall yield loss.

Yet another implementation of a multi-chip package is termed "Package-on-Package" (PoP). In this approach, one monolithic package is stacked on top of another package using standard interconnects for routing signals between the two packages.

As new generations of electrical consumer products are developed there is a growing need to improve the functionality, performance, reliability, and manufacturing robustness of semiconductor packages. Additionally, new handheld consumer electronic devices such as cell phones and new laptop computers are increasingly designed to present a low-profile. This design trend imposes severe limitations on the thickness of individual electronic components.

One drawback of existing PiP or PoP packages is that they do not provide sufficient versatility for integration into larger multi-chip packages. Thus, a need still remains for a multi-chip package system that incorporates the modularity of the internal stacking module approach while providing greater interconnection capabilities and minimizing the overall thickness of the package. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing a package system including providing a first semiconductor die; mounting a second semiconductor die on the first semiconductor die using an inter-die interconnect to form a flip-chip assembly; and attaching the flip-chip assembly on a package substrate with a contact pad, a test connection, a z-bond pad, and a die receptacle, with the first semiconductor die in the flip-chip assembly fitting inside the die receptacle.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the semiconductor die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements. The term "system" as used herein refers to and is defined as the method and as the apparatus of the present invention in accordance with the context in which the term is used.

Figure 1:
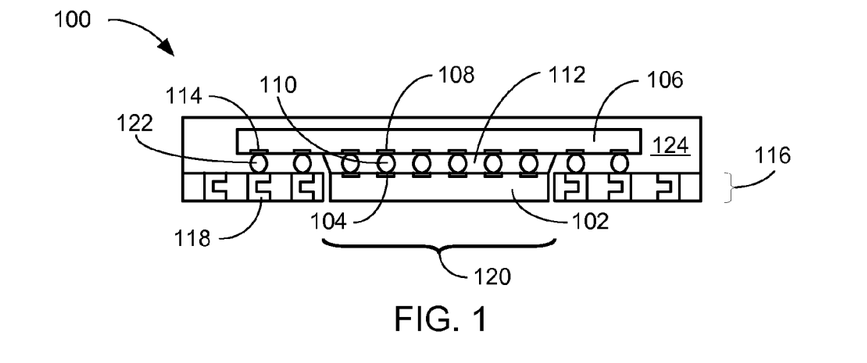
FIG. 1 is shown a cross-sectional view of a package system in an embodiment of the present invention.

Referring now to FIG. 1, therein is shown a cross-sectional view of a package system 100 in an embodiment of the present invention. The package system 100 incorporates a first semiconductor die 102 with a connection pad 104 and a second semiconductor die 106 with a connection pad 108. The first semiconductor die 102 has smaller lateral dimensions than the second semiconductor die 106. The term "lateral dimensions" as used herein refers to the dimensions of the top or bottom plane of a semiconductor die.

The first semiconductor die 102 is flip-chip mounted on the second semiconductor die 106 using an inter-die interconnect 110 as a means for connecting the connection pad 104 in the first semiconductor die 102 to the connection pad 108 in the second semiconductor die 106. The inter-die interconnect 110 may be implemented using a solder ball, a bump, a stud, or other interconnect elements known in the art.

An underfill material 112 is placed between the first semiconductor die 102 and the second semiconductor die 106. The term "underfill material" as used herein refers to a low-viscosity filling material that hardens into a solid state after cure. The underfill material 112 provides mechanical support and helps relieve mechanical stress induced by the inter-die interconnect 110.

The second semiconductor die 106 includes a peripheral connection pad 114 that is placed in exposed portions of the surface of the second semiconductor die 106 that are not covered by the first semiconductor die 102. The peripheral connection pad 114 is an enabling feature that facilitates making connections external to the flip-chip assembly connecting the first semiconductor die 102 to the second semiconductor die 106.

The package system 100 also incorporates a package substrate 116 with a contact pad 118 and a die receptacle 120. The first semiconductor die 102 fits inside the die receptacle 120. In the preferred embodiment of the invention, the package substrate 116 is at least as thick as the first semiconductor die 102, which is as thin as possible without significantly impacting manufacturing yield.

A peripheral interconnect 122 provides a mechanical and electrical connection between the second semiconductor die 106 and the contact pad 118 in the package substrate 116. The peripheral interconnect 122 may be implemented using a solder ball, a bump, a stud, or other interconnect elements known in the art. A molded encapsulant 124 seals at least portions of the package substrate 116, the peripheral interconnect 122, the underfill material 112, and the second semiconductor die 106.

One important advantage of the package system 100 is the availability of the peripheral connection pad 114 for making interconnections between the second semiconductor die 106 to external elements such as the package substrate 116. Another advantage is the integration of the first semiconductor die 102 and the second semiconductor die 106 into a low-profile package enabled by the die receptacle 120. Yet another advantage of the package system 100 is that it can be employed as an internal stacking module that can be incorporated within a multi-chip package.

Figure 2:
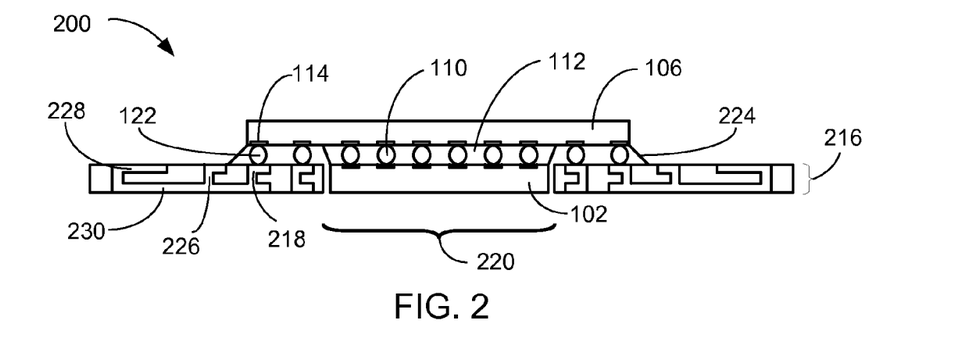
FIG. 2 a cross-sectional view of a package system taken across line 2-2 in FIG. 3.
Figure 3:
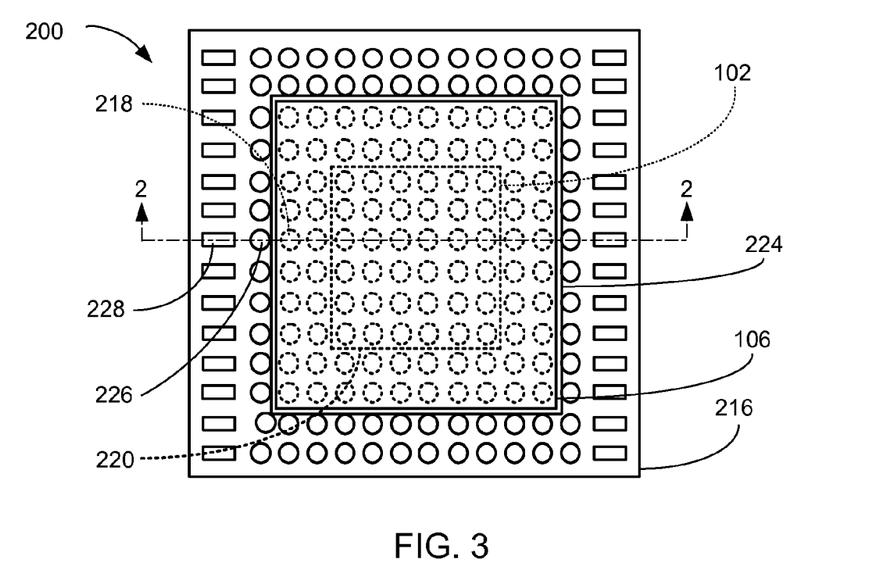
FIG. 3 is a top view of the package system shown in FIG. 2.

Referring now to FIG. 2, therein is shown a cross-sectional view of a package system 200 taken across line 2-2 in FIG. 3. Similar to the package system 100 shown in FIG. 1, the package system 200 incorporates the first semiconductor die 102 flip-chip mounted to the second semiconductor die 106 using the inter-die interconnect 110 and the underfill material 112. The first semiconductor die 102 has smaller lateral dimensions than the second semiconductor die 106.

The package system 200 also incorporates a package substrate 216 having a contact pad 218, a test pad 226, a z-bond pad 228, and a die receptacle 220. The package substrate 216 can have the contact pad 218, the test pad 226, the z-bond pad 228, or a combination thereof on a top surface of the package substrate 218. The first semiconductor die 102 fits within the die receptacle 220 in the package substrate 216. The peripheral interconnect 122 provides a mechanical and electrical connection between the peripheral connection pad 114 in the second semiconductor die 106 and the contact pad 218 in the package substrate 216.

The test pad 226 provides an electrical connection to the second semiconductor die 106, and through it, to the first semiconductor die 102. The test pad 226 is accessible to external test equipment (not shown) thus enabling electrical testing prior to integration of the package system 200 into a multi-chip package. This capability is useful for building multi-chip packages using "good known packages," reducing yield loss in the fabrication of the larger multi-chip module.

The z-bond pad 228 is an edge connector for bonding vertical or z-direction bond wires in an x-y-z coordinate system where the surface of the bond pad is parallel to the x-y plane. The z-bond pad 228 is an edge connector for bond wire connections to elements external to the package system 200. An internal connection 230 embedded within the package substrate 216 provides a means for connecting the test pad 226 or the z-bond pad 228 to the contact pad 218 and, through the peripheral interconnect 122, to the integrated circuits contained within the second semiconductor die 106.

Instead of using the molded encapsulant 124 to seal the package as is done for the package system 100 of FIG. 1, the package system 200 incorporates an underfill material 224 for sealing at least portions of the second semiconductor die 106, the peripheral interconnect 122, and the package substrate 216.

It has been discovered that one important advantage of the package system 200 is the availability of the test pad 226 for in-line testing of the package system 200. Another advantage of the package system 200 that has been discovered is that the z-bond pad 228 enables further integration to elements external to the package system 200. Thus the package system 200 can support solder ball, bump or stud connections to the contact pad 218 and bond wire connections to the z-bond pad 228. This versatility is enabling in integrating the internal stacking module into a wide variety of multi-chip package configurations.

Referring now to FIG. 3, therein is shown a top view of the package system 200 shown in FIG. 2. For clarity, the edge of the first semiconductor die 102 coincides with the outline of the die receptacle 220, representing a tight fit of the semiconductor die 102 inside the die receptacle 220. The second semiconductor die 106 covers the first semiconductor die 102, the contact pad 218, and a portion of the package substrate 218. The underfill material 224 extends beyond the edge of the second semiconductor die 106. The z-bond pad 228 is located at the edge of the package substrate 216, next to the test pad 226.

Figure 4:
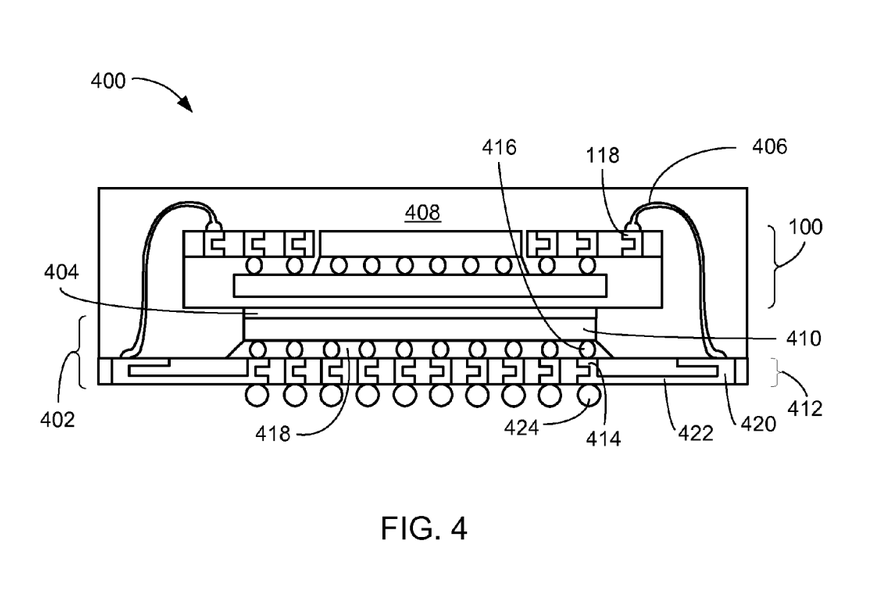
FIG. 4 is a cross-sectional view of a multi-chip package system incorporating the package system of FIG. 1 in one embodiment of the present invention.

Referring now to FIG. 4, therein is shown a cross-sectional view of a multi-chip package system 400 incorporating the package system 100 of FIG. 1 in one embodiment of the present invention. The multi-chip package system 400 includes the package system 100 mounted upside-down on a bottom package assembly 402 using an adhesive 404.

A bond wire 406 connects the package system 100 to the bottom package assembly 402. A molded encapsulant 408 surrounds at least portions of the package system 100, the bottom package assembly 402, and the bond wire 406.

The bottom package assembly 402 contains a third semiconductor die 410 mounted on a second package substrate 412 in a flip-chip configuration. The third semiconductor die 410 is connected to a contact pad 414 on the second package substrate 412 through a bottom interconnect 416 implemented using a solder ball, a bump, a stud, or other interconnect elements known in the art. An underfill material 418 provides mechanical support between the third semiconductor die 410 and the second package substrate 412.

In the package system 400, the bond wire 406 is used to electrically connect the package system 100 to elements external to the package system 400. The electrical path between the package system 100 and the elements external to the multi-chip package system 400 is provided by the contact pad 118 in the package system 100, the bond wire 406, a z-bond pad 420 in the second package substrate 412, an internal connection 422 in the second package substrate 412, the contact pad 414 in the second package substrate 412, and an external interconnect 424.

Similarly, the electrical path between the package system 100 and the third semiconductor die 410 in the bottom package assembly 402 is provided by the contact pad 118 in the package system 100, the bond wire 406, the z-bond pad 420 in the second package substrate 412, the internal connection 422 in the second package substrate 412, the contact pad 414 in the second package substrate 412, and the bottom interconnect 416.

The electrical paths described in FIG. 4 are schematic and are drawn to illustrate some of the elements used to accomplish electrical connections between the package system 100 and elements external to the multi-chip package system 400, and between the package system 100 and the third semiconductor die 410. These two electrical paths may or may not have common elements.

Figure 5:
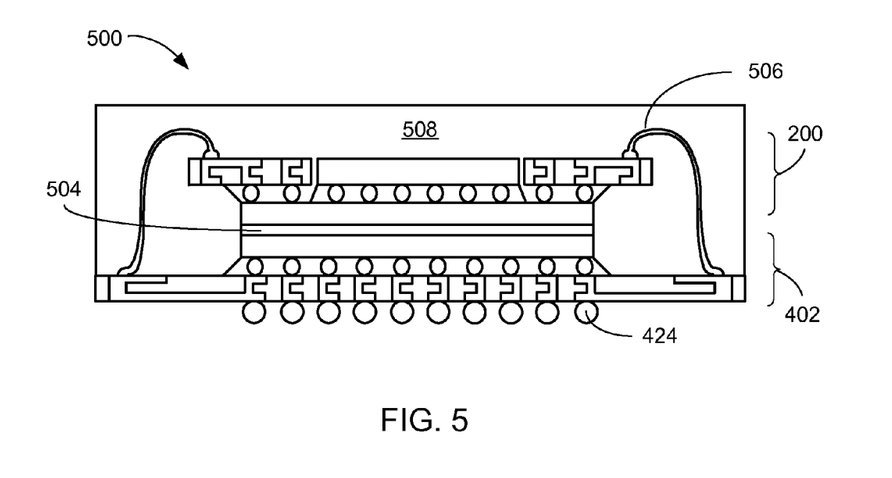
FIG. 5 is a cross-sectional view of a multi-chip package system incorporating the package system of FIG. 2 in one embodiment of the present invention.

Referring now to FIG. 5, therein is shown a cross-sectional view of a multi-chip package system 500 incorporating the package system 200 of FIG. 2 in one embodiment of the present invention. The multi-chip package system 500 includes the package system 200 mounted upside-down on the bottom package assembly 402 using an adhesive 504.

A bond wire 506 connects the package system 200 to the bottom package assembly 402. A molded encapsulant 508 surrounds at least portions of the package system 200, the bottom package assembly 402, and the bond wire 506

Figure 6:
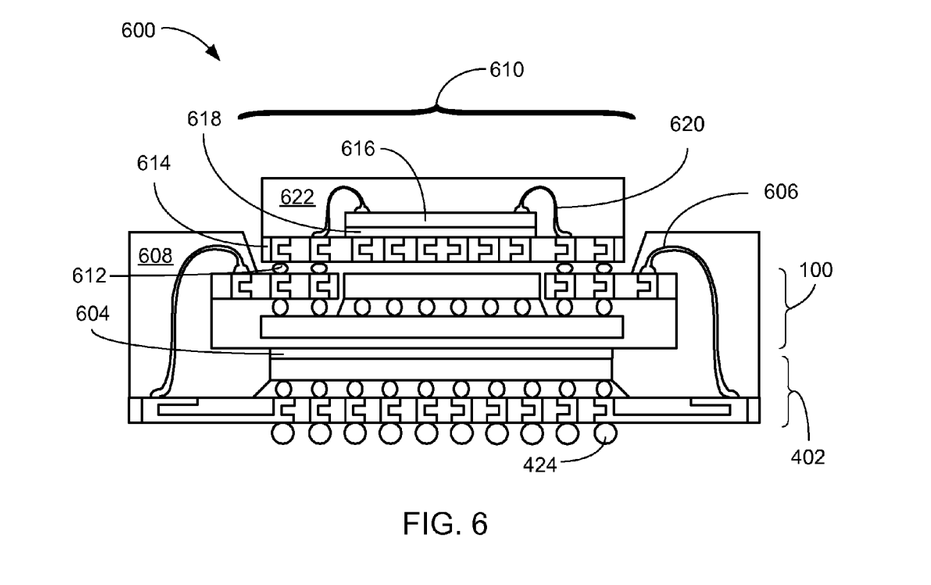
FIG. 6 is a cross-sectional view of a Package-on-Package system incorporating four semiconductor dies in one embodiment of the present invention.

Referring now to FIG. 6, therein is shown a cross-sectional view of a Package-on-Package system 600 incorporating four semiconductor dies in one embodiment of the present invention. The Package-on-Package system 600 includes the package system 100 mounted upside-down on the bottom package assembly 402 using an adhesive 604.

A bond wire 606 connects the package system 100 to the bottom package assembly 402. A molded encapsulant 608 surrounds at least portions of the package system 100, the bottom package assembly 402, and the bond wire 606. The external interconnect 424 provides an electrical connection between the multi-chip package system and elements external to the multi-chip package system 600.

A top package assembly 610 is integrated in the Package-on-Package 600 using an inter-package interconnect 612 connecting a third package substrate 614 in the top package assembly 610 to the package system 100. The inter-package interconnect 612 may be implemented using a solder ball, a bump, a stud, or other interconnect elements known in the art. The top package assembly 610 is a single-chip package incorporating a fourth semiconductor die 616 mounted on the third package substrate 614 using an adhesive 618.

A bond wire 620 provides an electrical connection between the fourth semiconductor die 616 and the third package substrate 614. A third molded encapsulant 622 seals at least portions of the third package substrate 614, the fourth semiconductor die 616, and the bond wire 620.

Figure 7:
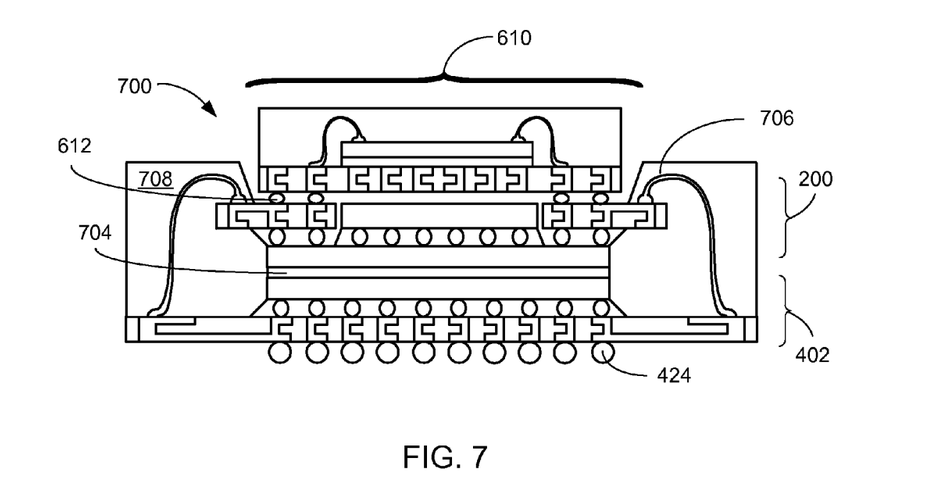
FIG. 7 is a cross-sectional view of a Package-on-Package system incorporating four semiconductor dies in one embodiment of the present invention.

Referring now to FIG. 7, therein is shown a cross-sectional view of a Package-on-Package system 700 incorporating four semiconductor dies in one embodiment of the present invention. The Package-on-Package system 700 includes the package system 200 mounted upside-down on the bottom package assembly 402 using an adhesive 704.

A bond wire 706 connects the package system 200 to the bottom package assembly 402. A molded encapsulant 708 surrounds at least portions of the package system 200, the bottom package assembly 402, and the bond wire 706. The external interconnect 424 provides an electrical connection between the Package-on-Package system 700 and elements external to the Package-on-Package system 700.

The top package assembly 610 is integrated in the Package-on-Package system 700 using the inter-package interconnect 612 connecting the top package assembly 610 to the package system 200. The top package assembly 610 can be attached to the package system 200 over the first semiconductor die 102, the second semiconductor die 106, or a combination thereof.

Figure 8:
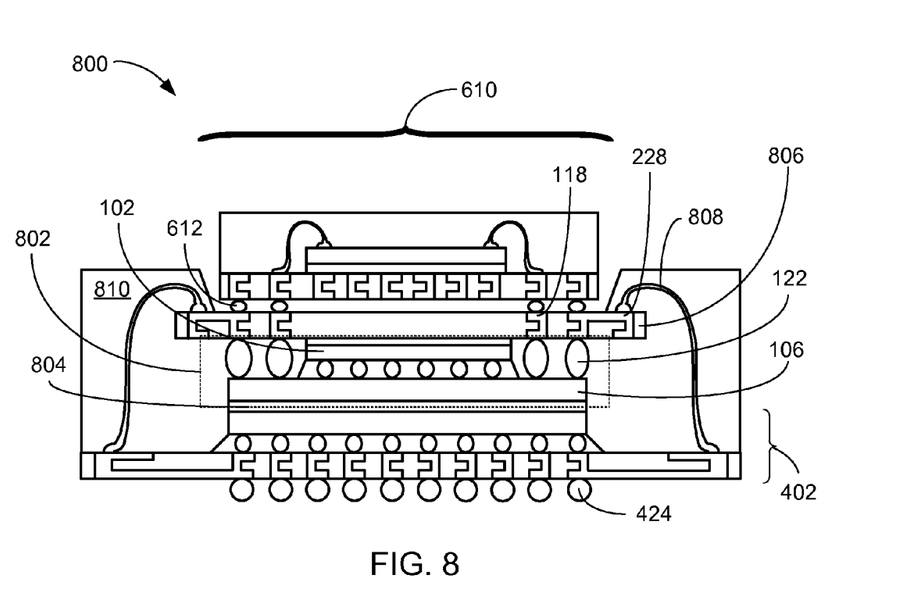
FIG. 8 is a cross-sectional view of a Package-on-Package system incorporating four semiconductor dies and an interposer in one embodiment of the present invention.

Referring now to FIG. 8, therein is shown a cross-sectional view of a Package-on-Package system 800 incorporating four semiconductor dies and an interposer in one embodiment of the present invention. The Package-on-Package system 800 is built on the bottom package assembly 402.

A flip-chip assembly 802 incorporating the first semiconductor die 102 and the second semiconductor die 106 replaces the package system 100 used for the multi-chip package system 600 of FIG. 6, or the package system 200 used for the Package-on-Package system 700 of FIG. 7. The flip-chip assembly 802 is mounted on the bottom package assembly 402 using an adhesive 804.

An interposer 806 with the contact pad 118 and the z-bond pad 228 mounted on the flip-chip assembly 802 serves as an interconnection vehicle between the flip-chip assembly 802 and the bottom package assembly 402 and between the flip-chip assembly 802 and the top package assembly 610. The interposer 806 is connected to the bottom package assembly 402 using a bond wire 808, to the flip-chip assembly 802 through the peripheral interconnect 122, and to the top package assembly 610 using the inter-package interconnect 612. The external interconnect 424 provides a connection to elements external to the Package-on-Package system 800.

Figure 9:
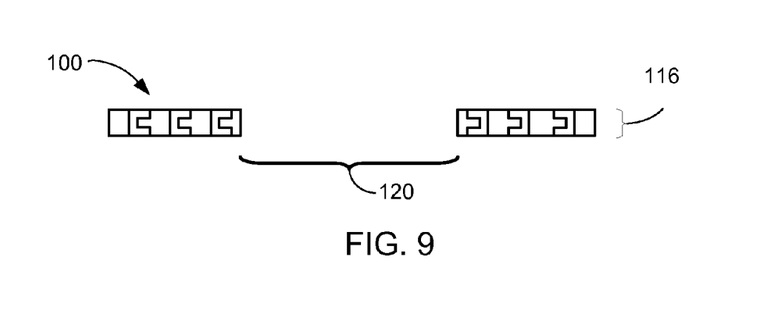
FIG. 9 is shown a cross-sectional view of the package system in the initial stages of fabrication according to an embodiment of the present invention.

Referring now to FIG. 9, therein is shown a cross-sectional view of the package system 100 in the initial stages of fabrication according to an embodiment of the present invention. The fabrication results in the formation of the package system 100 shown in FIG. 1. At the initial stage of the fabrication shown in FIG. 9 the package substrate 116 with a die receptacle is provided.

Figure 10:
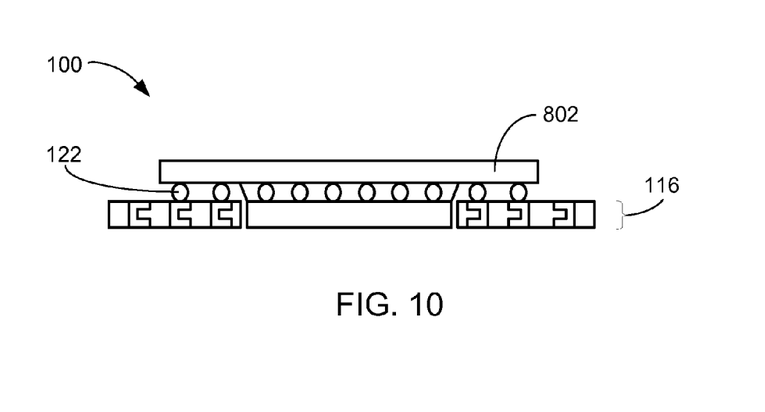
FIG. 10 is the structure of FIG. 9 following the attachment of the flip-chip assembly using the peripheral interconnect.

Referring now to FIG. 10, therein is shown the structure of FIG. 9 following the attachment of the flip-chip assembly 802 using the peripheral interconnect 122. Following attachment of the flip-chip assembly 802, the structure is cleaned using a plasma clean.

Figure 11:
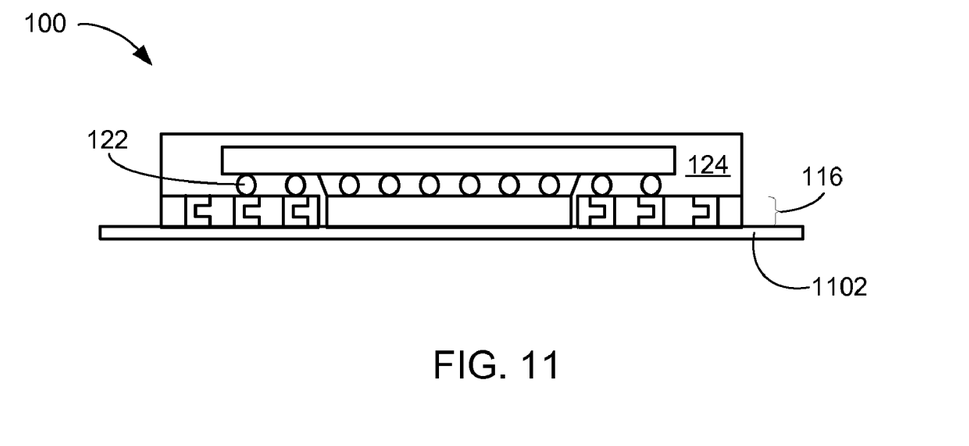
FIG. 11 is the structure of FIG. 10 following mounting of the package substrate on a tacky film and application of the molded encapsulant.

Referring now to FIG. 11, therein is shown the structure of FIG. 10 following mounting of the package substrate 116 on a tacky film 1102 and application of the molded encapsulant 124. The tacky film 1102 is an optional means for supporting the package substrate 116 during fabrication. The molded encapsulant covers at least portions of the flip-chip assembly 802, the peripheral interconnect 122, and the package substrate 116. The fabrication process is complete following singulation of the package system 100 and removal of the tacky film 1102. This last step completes the fabrication of the package system 100 shown in FIG. 1.

Figure 12:
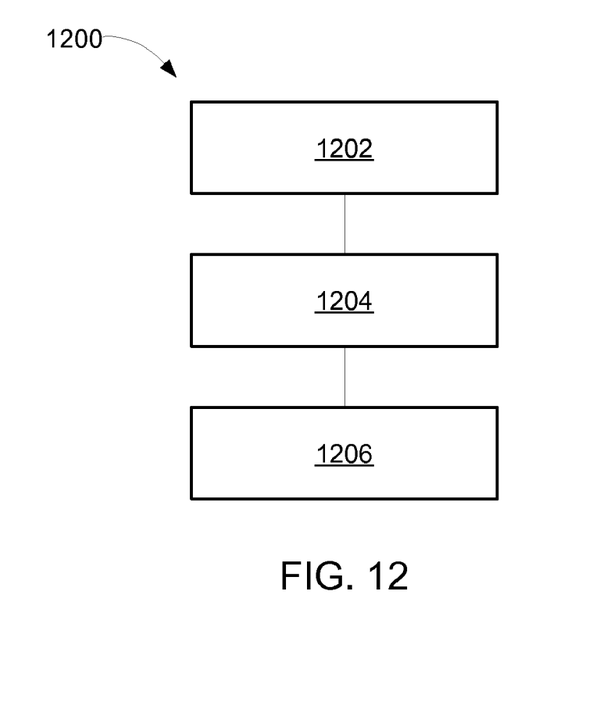
FIG. 12 is a flow chart of a package system for manufacturing a package system incorporating a flip-chip assembly in an embodiment of the present invention.

Referring now to FIG. 12, therein is shown a flow chart of a package system 1200 for manufacturing a package system incorporating a flip-chip assembly in an embodiment of the present invention. The package system 1200 includes providing a first semiconductor die in a block 1202; mounting a second semiconductor die on the first semiconductor die using an inter-die interconnect to form a flip-chip assembly in a block 1204; and attaching the flip-chip assembly on a package substrate with a contact pad, a test connection, a z-bond pad, and a die receptacle, with the first semiconductor die in the flip-chip assembly fitting inside the die receptacle in a block 1206.

It has been discovered that the present invention thus has numerous aspects.

A principal aspect that has been unexpectedly discovered is that the present invention that it provides a central flip-chip assembly with a peripheral contact pad that enables integration within a self-contained module or as an internal stacking module or component of a larger multi-chip package system.

Another aspect is that the invention is that the availability of a package substrate or interposer with a z-bond pad also enables integration with other package assemblies using bond wires. Further, the availability of a test connection facilitates testing of internal stacking modules prior to assembly into a multi-chip package system.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the package system of the present invention furnishes important and heretofore unknown and unavailable solutions, capabilities, and functional aspects for providing electromagnetic interference shielding for semiconductor packages. The resulting processes and configurations are straightforward, cost-effective, uncomplicated, highly versatile and effective, can be surprisingly and unobviously implemented by adapting known technologies, and are thus readily suited for efficiently and economically manufacturing semiconductor packages fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a package system, comprising:
    providing a first semiconductor die;
    mounting a second semiconductor die on the first semiconductor die using an inter-die interconnect to form a flip-chip assembly; and
    attaching the flip-chip assembly on a package substrate having a contact pad, a test connection, and a z-bond pad coplanar with a top surface of the package substrate, and having a die receptacle, with the first semiconductor die in the flip-chip assembly fitting inside the die receptacle.

2. The method of claim 1 further comprising encapsulating at least portions of the second semiconductor die and the package substrate using a molded encapsulant or an underfill material.

3. The method as claimed in claim 1 further comprising attaching the flip-chip assembly on a bottom package assembly incorporating a third semiconductor die and a second package substrate.

4. The method as claimed in claim 1 wherein:
    mounting of the flip-chip assembly is performed on an interposer; and
further comprising:
    mounting a top package assembly on the interposer.

5. The method as claimed in claim 1 further comprising attaching a top package assembly over the flip-chip assembly using an inter-package interconnect.

6. A method for manufacturing a package system, comprising:
    providing a first semiconductor die;
    mounting a second semiconductor die on the first semiconductor die using an inter-die interconnect to form a flip-chip assembly, the second semiconductor die having a peripheral connection pad in a portion that is not covered by the first semiconductor die;
    placing a peripheral interconnect on the peripheral connection pad; and
    mounting the flip-chip assembly on a package substrate having a contact pad, a test connection, and a z-bond pad coplanar with a top surface of the package substrate, and having a die receptacle, with the first semiconductor die in the flip-chip assembly fitting inside the die receptacle.

7. The method of claim 6 further comprising encapsulating at least portions of the second semiconductor die, the package substrate, and the peripheral interconnect using a molded encapsulant or an underfill material.

8. The method as claimed in claim 6 further comprising:
    mounting the flip chip assembly with the package substrate upside-down on a bottom package assembly incorporating a second package substrate;
    connecting the contact pad or the z-bond-pad in the package substrate to the second package substrate using a bond wire; and
    encapsulating at least portions of the package substrate, the bottom package assembly, and the bond wire using a molded encapsulant.

9. The method as claimed in claim 6 further comprising:
    mounting the flip chip assembly with the package substrate upside-down on a bottom package assembly; and mounting a top package assembly on the package substrate using an inter-package interconnect.

10. The method as claimed in claim 6 wherein:
mounting the flip-chip assembly is performed on an interposer;
further comprising:
mounting the flip chip assembly with the interposer upside-down on a bottom package assembly incorporating a second package substrate;
connecting the interposer to the second package substrate using a bond wire;
encapsulating at least portions of the interposer, the bottom package assembly, and the bond wire using a molded encapsulant; and
mounting a top package assembly on the interposer using an inter-package interconnect.

* * * * *